United States Patent
Kocaman et al.

(10) Patent No.: US 7,205,841 B2
(45) Date of Patent: Apr. 17, 2007

(54) AUTOMATIC GAIN CONTROL WITH THREE STATES OF OPERATION

(75) Inventors: Namik Kemal Kocaman, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 203 days.

(21) Appl. No.: 11/112,041

(22) Filed: Apr. 22, 2005

(65) Prior Publication Data

US 2006/0238255 A1   Oct. 26, 2006

(51) Int. Cl.
*H03G 3/10* (2006.01)
(52) U.S. Cl. ........................... 330/279; 375/345
(58) Field of Classification Search ............... 330/307, 330/279, 291
See application file for complete search history.

(56) References Cited

U.S. PATENT DOCUMENTS

| | | | |
|---|---|---|---|
| 4,514,703 A * | 4/1985 | Maher et al. | 330/279 |
| 6,577,852 B1 * | 6/2003 | Iwata et al. | 455/240.1 |
| 6,621,345 B2 * | 9/2003 | Matsugatani et al. | 330/281 |
| 6,927,632 B2 * | 8/2005 | Sjursen et al. | 330/279 |
| 2004/0110525 A1 * | 6/2004 | Black et al. | 455/522 |

* cited by examiner

*Primary Examiner*—Robert Pascal
*Assistant Examiner*—Alan Wong

(57) ABSTRACT

A method and apparatus for an automatic gain control (AGC) loop that utilizes freezing and unfreezing states. A freezing process moves the AGC into a TRANSITION state from a NORMAL state, based on net change of VGA gain control codes over a monitoring time window. The freezing process then moves the AGC into a FROZEN state from the TRANSITION state, based on net change of VGA gain control codes over the monitoring time window. An unfreezing process moves the AGC into the NORMAL state from the FROZEN state, based on signal amplitude changes at the output of the VGA.

20 Claims, 6 Drawing Sheets

AUTOMATIC GAIN CONTROL WITH THREE STATES OF OPERATION

FIELD OF THE INVENTION

This application is related to an automatic gain control (AGC), and more particularly to an AGC with three states of operation.

BACKGROUND OF THE INVENTION

Automatic gain control (AGC) circuits generate a relatively constant output signal amplitude from an input signal with varying amplitude. A typical AGC circuit includes a loop having a variable gain amplifier (VGA). A common application of an AGC circuit is in digital communication systems. An ideal AGC action would provide a constant output for all values of input signal strength. The figure of merit applied to AGC action is given as the change in input required for a given output change.

In high speed (e.g., 10 giga bits per second (Gb/s)), high performance, serial communication receivers that require equalization, VGAs are sometimes used at the front end of the topology. A VGA is used to either provide gain or attenuation depending on the amplitude of the input signal such that the VGA outputs a substantially constant amplitude signal. The ability to adjust the gain/attenuation of the VGA so that both a large and a small input voltage swing range at the input to the receiver can be accommodated is desirable for 10 Gb/s serial data communication applications.

A block diagram of a generic AGC block 10 is shown in FIG. 1. Amplitude Detector 14 senses the output amplitude Vout 13 of the VGA 12 and generates a voltage that represents the peak voltage of the VGA output $V_{pk}$ 15. A Summer 17 compares the detected amplitude $V_{pk}$ 15 to a reference voltage $V_{ref}$ 16. The reference voltage $V_{ref}$ 16 represents the desired output amplitude of the VGA. Based on the comparison, the Summer 17 generates an error signal 18 and feeds it to an AGC loop filter 19. In other words, Summer 17 determines the difference between the peak voltage $V_{pk}$ 15 and the reference voltage $V_{ref}$ 16, and adaptively adjusts the control voltage Vc 11, such that the VGA 12 produces an output swing that is equal to a pre-determined and fixed amplitude required by subsequent circuit blocks.

Depending on the application, there may be system requirements in which the minimum and maximum input swing range at the input to the receiver is wide. Thus, the AGC loop is kept constantly running. A continuous running AGC loop can interfere with the rest of the control loops causing signal interference, for example. It is desirable to freeze a loop once the convergence has been achieved since this improves the stability of the overall system performance. On the other hand, when the AGC loop is frozen, it needs to re-start in a timely and accurate manner for the required updates to track and correct the necessary changes in its input.

Therefore, there is a need for an AGC loop which can be frozen and then effectively re-start to ensure detection and tracking of convergence to the desired signal amplitude level.

SUMMARY OF THE INVENTION

In one embodiment, the present invention is a method for controlling gain of a VGA. The method includes: monitoring a net change in VGA gain, in a normal state; transitioning from the normal state to a transition state, if the net change in the VGA gain is less than a first threshold value during a first timing window; allowing an automatic gain control (AGC) loop to update the VGA gain, in the transition state; monitoring a net change in VGA gain, in the transition state; transitioning from the transition state to a frozen state, if the net change in the VGA gain is less than a second threshold value during a second timing window; and freezing the VGA gain, when in the frozen state.

In one embodiment, the present invention is a method for controlling gain of a VGA. The method includes: updating VGA gain control codes, in a normal state; monitoring a net change in VGA gain control codes, in the normal state; starting a timing window; changing from the normal state to a transition state, when the net change in the VGA gain control codes is less than a predetermined value at the end of the timing window; allowing an AGC loop to update VGA gain control codes, in the transition state; monitoring a second net change in VGA gain control codes, in the transition state; starting the timing window; changing from the transition state to a frozen state, if the net change in the VGA gain control codes is less than the predetermined value at the end of the timing window; and fixing the codes of the VGA, when in the frozen state.

In one embodiment, the present invention is an AGC for controlling the gain of a VGA. The AGC includes: means for monitoring a net change in VGA gain, in a normal state; means for transitioning from the normal state to a transition state, if the net change in the VGA gain is less than a first threshold value during a first timing window; means for allowing an automatic gain control (AGC) loop to update the VGA gain, in the transition state; means for monitoring a net change in VGA gain, in the transition state; means for transitioning from the transition state to a frozen state, if the net change in the VGA gain is less than a second threshold value during a second timing window; and means for freezing the VGA gain, when in the frozen state.

DETAILED DESCRIPTION

In one embodiment, the present invention is a method and apparatus for a digitally controlled automatic gain control (AGC) loop that utilizes freezing and unfreezing states. A freezing process moves the AGC into a FROZEN state from a NORMAL state, based on net change of VGA gain control codes over a monitoring time window. An unfreezing process moves the AGC into the NORMAL state from the FROZEN state, based on signal amplitude changes at the output of the VGA.

In one embodiment, the decision density at the input of the AGC is monitored. If the decision density is skewed to one side, an unfreeze condition is determined. While transitioning from a normal state to a freeze state, an intermediate state called transition state is utilized to avoid any false freezes due to abrupt changes in the input signal amplitude.

Figure 1:
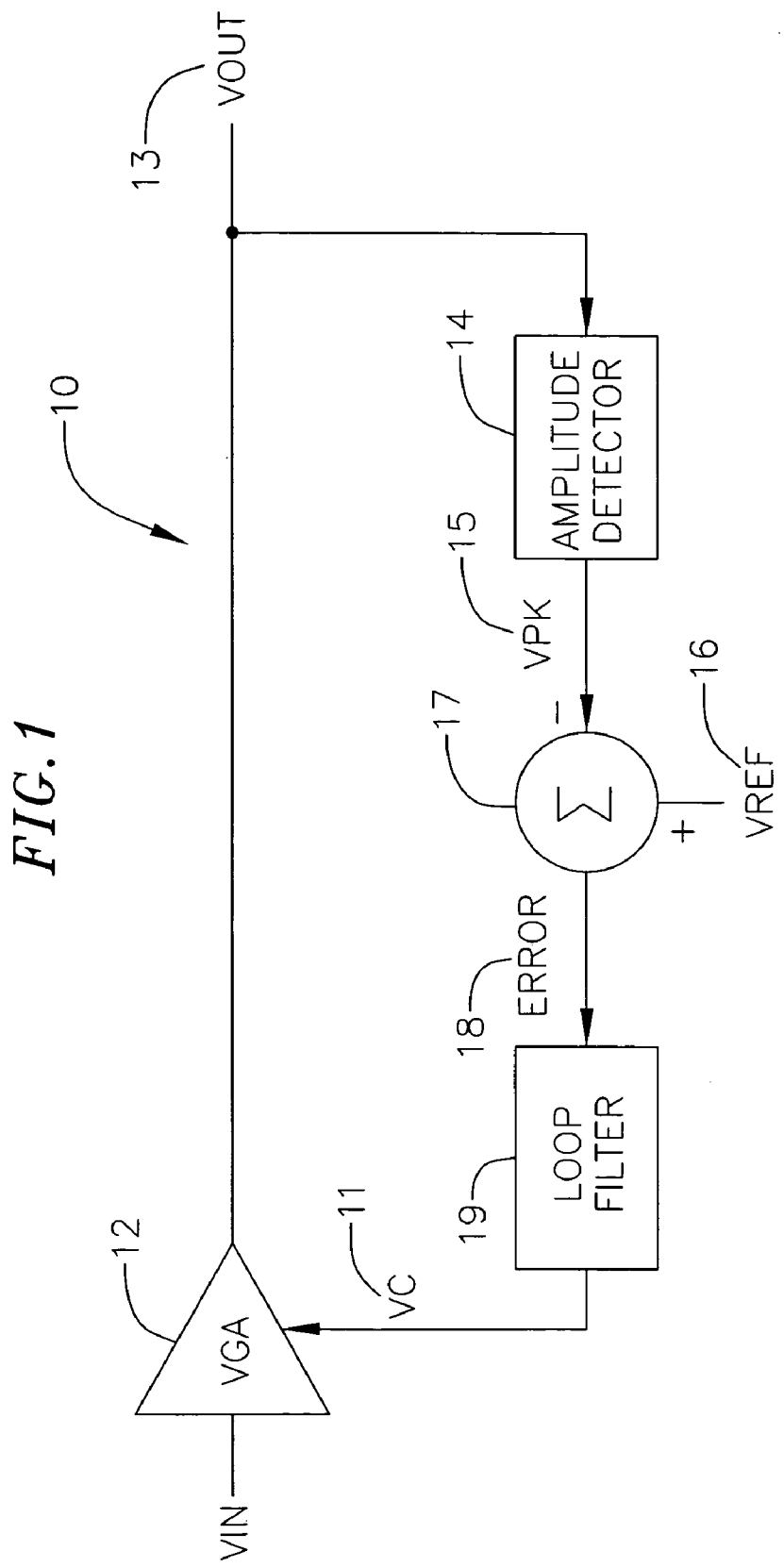
FIG. 1 is a block diagram of a generic automatic gain control (AGC)
Figure 2:
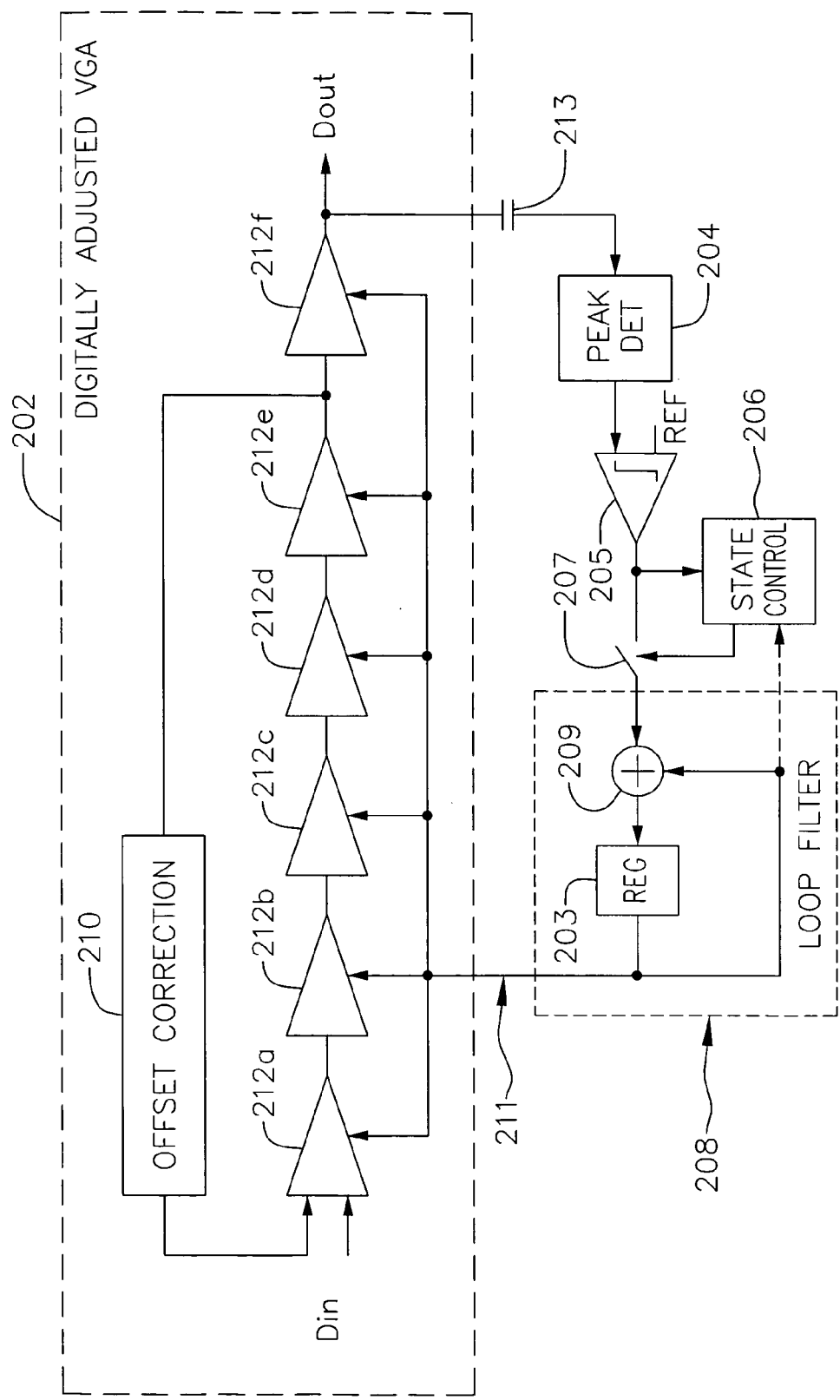
FIG. 2 is an exemplary digitally adjusted VGA loop, according to one embodiment of the present invention.

FIG. 2 is an exemplary digitally adjusted AGC loop including a digital filter, according to one embodiment of the present invention. As depicted in FIG. 2, a comparator 205, a state control logic 206 and a loop filter 208 are utilized to control the output amplitude of a digitally controlled VGA 202. The VGA 202 includes several cascaded stages (212a–212f). In this embodiment, six stages (212a–212f) are used to optimize gain range versus bandwidth requirement. A peak detection circuit 204 takes the filtered output of the VGA loop (filtered by the capacitor 213) and provides the amplitude information to the comparator 205. The comparator 205 compares the amplitude information to a reference voltage and outputs decisions, for example, a "1" (UP) or a "–1" (DOWN) decision, to the state control logic 206 and the loop filter 208, via a switch 207.

The output of the loop filter are VGA gain control codes 211 that are utilized to change the gain of the cascaded stages (212a–212f) of the VGA loop. The output of the loop filter 208 is also fed back to the state control logic 206. Based on the decisions from the comparator and the VGA gain control codes, the state control logic 206 closes the switch 207 for a normal operation, or opens the switch 207, for a freeze state. In one embodiment, the loop filter comprises of a digital accumulator that includes a summer 209 and a register 203. The previous VGA gain control codes in the register 203 are added to the current decisions coming from the comparator 205, by the summer 209. In one embodiment comparator 205 comprises of a plurality of comparators, each connected to a respective reference voltage that is a percentage higher or lower than a nominal reference voltage, which is the desired output level of the peak detector 204. This scheme is used to compare the VGA output amplitude to a desired signal level for state changes, described below.

Figure 3:
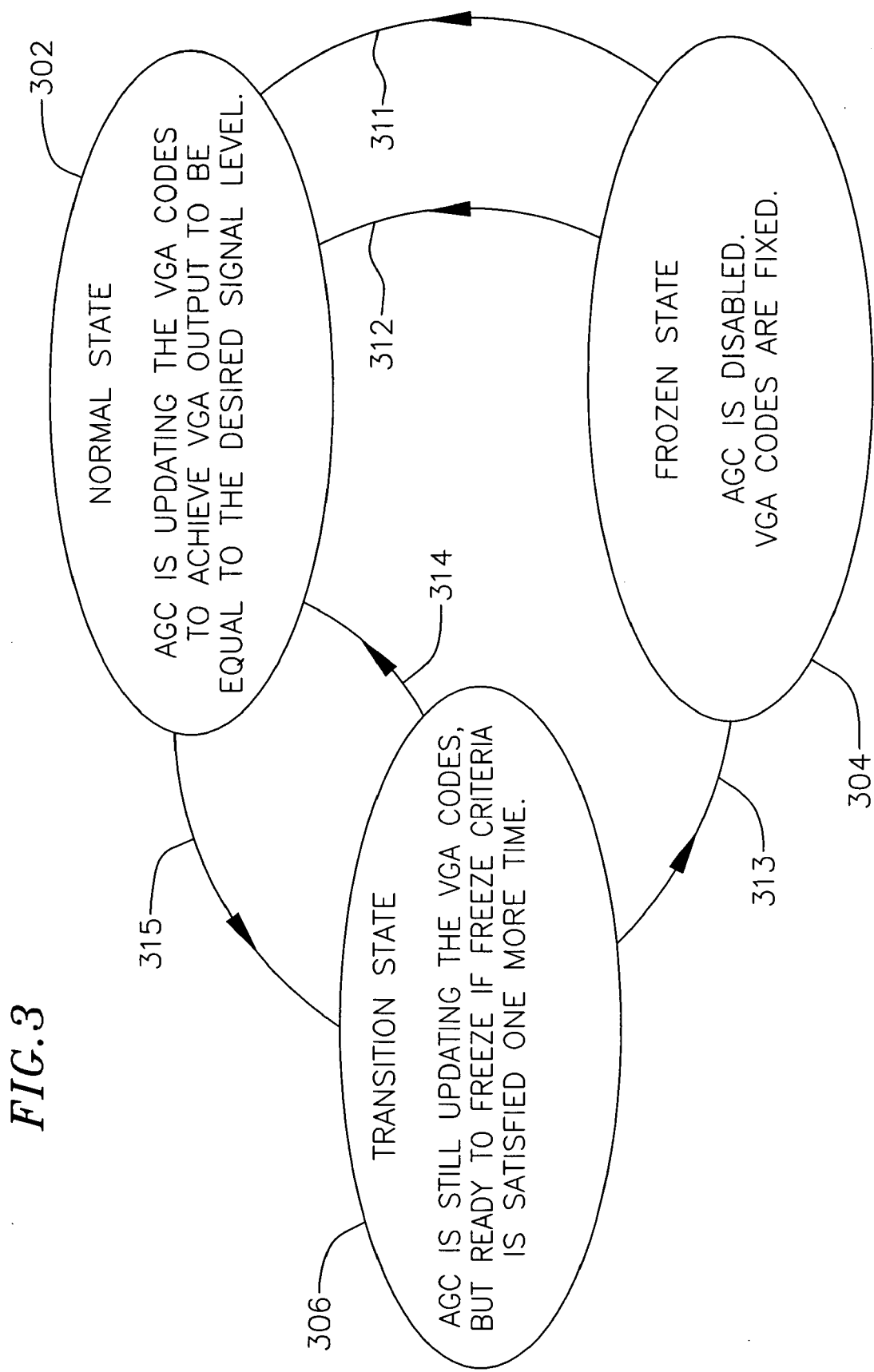
FIG. 3 is an exemplary state diagram of an AGC, according to one embodiment of the present invention.

FIG. 3 is an exemplary state diagram of an AGC, according to one embodiment of the present invention. As depicted in FIG. 3, the operation of the AGC includes three states. In a NORMAL state 302, AGC updates the VGA gain control codes based on the decisions it receives from the comparison of VGA output amplitude to the desired signal level. When the AGC achieves its goal of equalizing VGA output amplitude to the desired signal level, the VGA gain control codes start to converge. At the equilibrium, VGA gain control codes settle and start to chatter a few codes up or down of the settling point. This means that at the steady state the net change in VGA gain control codes should be within a certain threshold if the chattering is confined to within a few codes. The present invention utilizes this characteristic of the AGC loop in a freeze state.

A programmable monitoring time window (e.g., a counter) is established to monitor the VGA gain control codes. When in NORMAL state 302, if within the monitoring window, the net change in VGA gain control codes is less than a programmable threshold value, the AGC transitions from the NORMAL state 302 to a TRANSITION state 306, as shown by transition line 315. In the TRANSITION state 306, the AGC is still updating the VGA gain control codes, while the net change in VGA gain control codes is again monitored within the monitoring window.

If the net change in VGA gain control codes within the monitoring window is less than the threshold value for a second time, the AGC transitions from the TRANSITION state 306 to the FROZEN state 304, as shown by transition line 313. However, if the net change in VGA gain control codes is more than the threshold value, the AGC changes its state back to the NORMAL state 302, as illustrated by the transition line 314.

In the FROZEN state 304, the AGC is disabled and the VGA gain control codes are fixed. In one embodiment, when in the FROZEN state 304, the amplitude of the VGA output is monitored. If the amplitude deviates from a desired level by more than a certain (predetermined) percentage or amount, the AGC transitions back to the NORMAL state 302, as shown by the transition line 312. In one embodiment, when in the FROZEN state 304, the decision density of the VGA is monitored. If the decisions are leaning toward one direction (i.e., up or down) by more than a certain (predetermined) decision density, the AGC transitions back to the NORMAL state 302, as depicted by the transition line 311.

Figure 4:
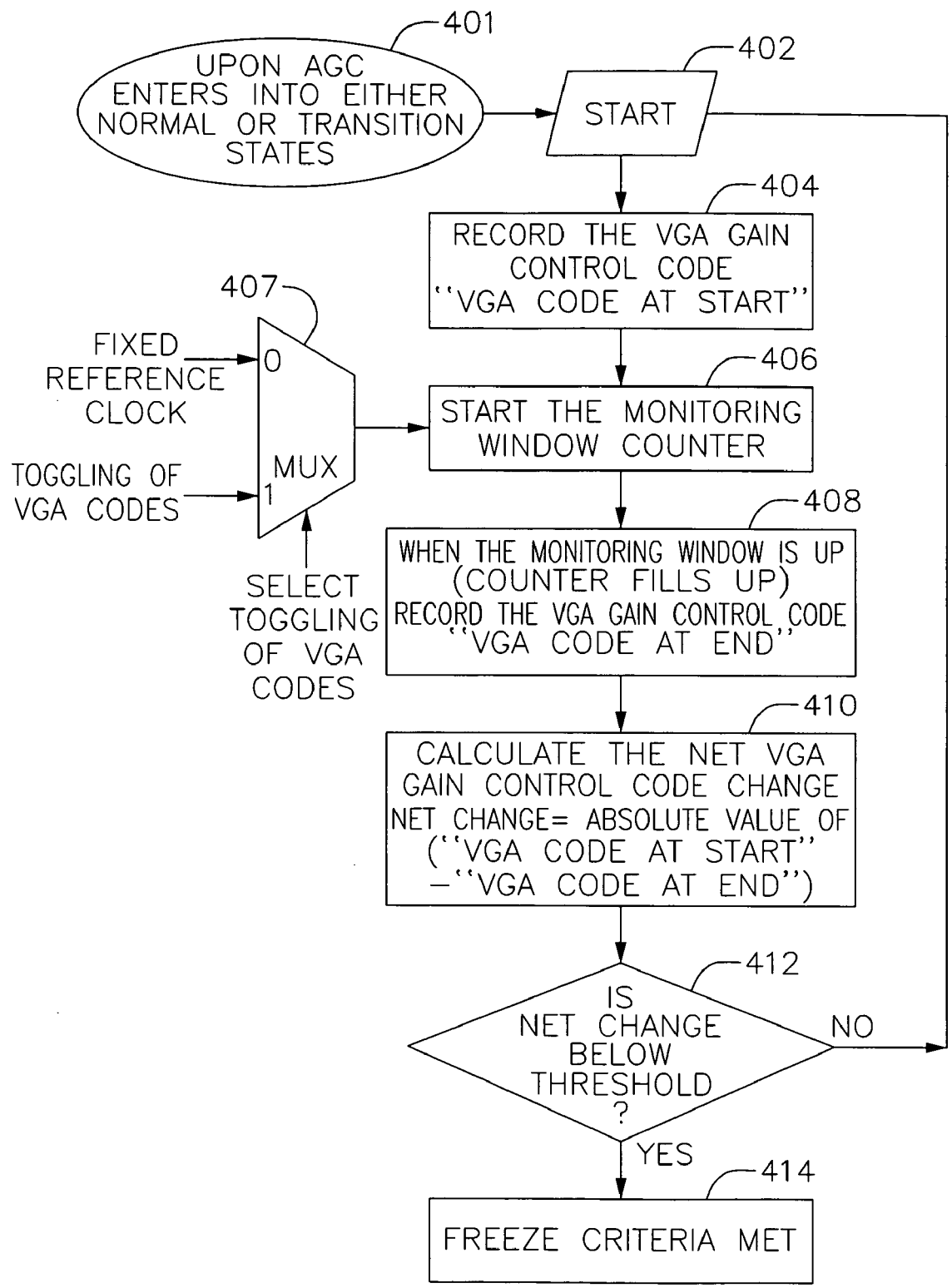
FIG. 4 is an exemplary process flow for determining a freeze criteria of an AGC, according to one embodiment of the present invention.

FIG. 4 is an exemplary process flow for determining a freeze criteria of an AGC, according to one embodiment of the present invention. As illustrated in blocks 401, 402 and 403, upon entering to a NORMAL or TRANSITION state, the VGA gai control code is recorded, as "VGA Code at Start." In block 406, a monitoring (timing) window is started and the VGA gain control codes are monitored within the monitoring window. In one embodiment, the monitoring window is realized by using a counter. The counter can be triggered using a fixed frequency reference or toggling of the VGA gain control codes, as shown by the multiplexor 407.

In block 408, when the monitoring window is completed ("UP"), that is, when the counter reaches the end of its (programmed) count, the VGA gain control code is recorded again, as "VGA Code at End." In block 410, the net changes in the VGA gain control code is calculated according to the following condition:

Net Change=Absolute Value of (VGA Code at Start–VGA Code at End)

In block 412, if the net change in the VGA gain control codes within the monitoring window falls below a predetermined threshold value, the freeze criteria is met (block 414). If the net change in the VGA gain control codes does not fall below the predetermined threshold value, the freezing criteria process starts again in block 402.

In order to avoid any false freezes due to abrupt input amplitude changes, the freezing criteria process is repeated one more time. For example, if towards the end of the timing window a substantial change in the input signal amplitude occurs, the net change in the VGA gain control codes for the entire timing window may still fall below the threshold value and therefore causing the VGA to falsely move to the FROZEN state.

Thus, the TRANSITION state is utilized to incorporate the double checking or repeating of the freezing criteria process. Upon fulfillment of the second freeze criteria, the AGC moves into FROZEN state. The freezing criteria process may be repeated more than once, depending on the system environment and parameters, and the accuracy/speed trade offs. The monitoring windows for the two freezing criteria process may have the same or may have different durations.

Figure 5:
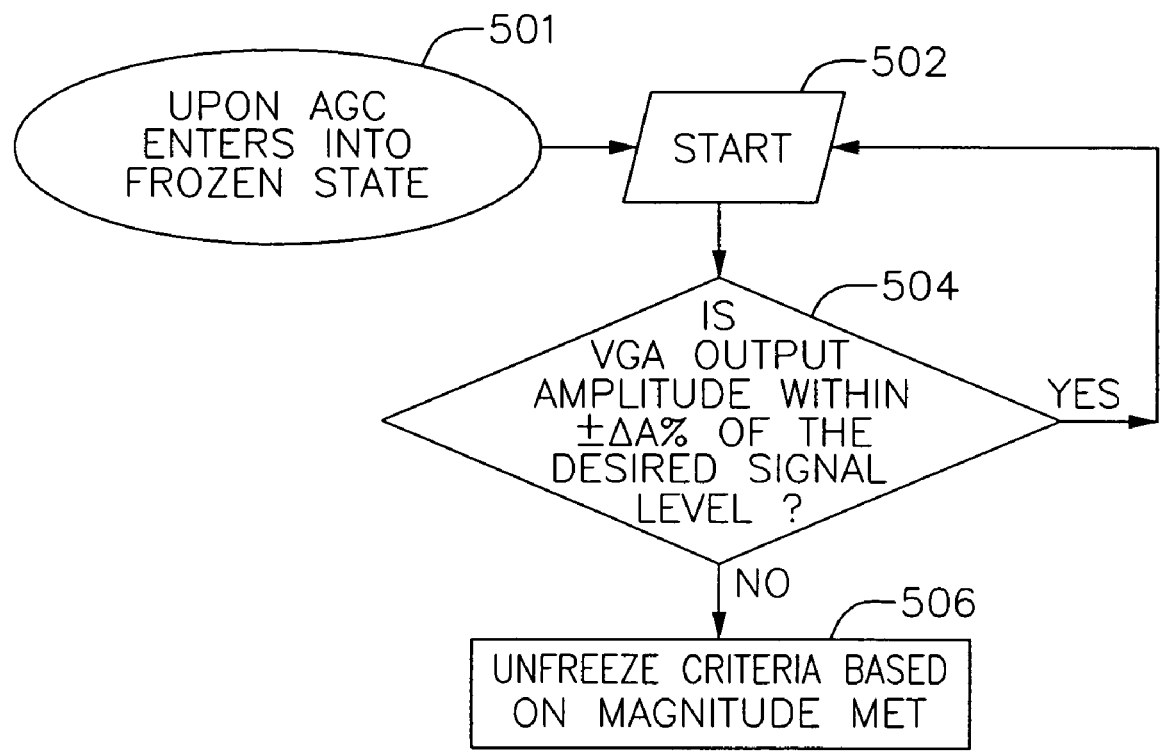
FIG. 5 is an exemplary process flow for determining an unfreeze criteria of an AGC based on some parameters of the VGA output, according to one embodiment of the present invention.

FIG. 5 is an exemplary process flow for determining an unfreeze criteria of an AGC based on some parameters of the VGA output, such as the amplitude of the VGA output, according to one embodiment of the present invention. As depicted in blocks 501 and 502, upon entering to the FROZEN state, the magnitude of the VGA output is monitored. In block 504, the VGA output amplitude is compared to a desired signal level. If the VGA output amplitude deviates more than ±ΔA (a programmable value) percent of the desired signal level, the unfreeze criteria is met (block 506) and the AGC transitions back to the NORMAL state. If the VGA output amplitude does not deviate more than +ΔA percent of the desired signal level, the unfreeze criteria process starts over, in block 502. In one embodiment, a ΔA equal to 10 is used, however, ΔA can be smaller or larger in other applications. Other parameters of the VGA output, such as power, RMS, and/or peak may be utilized for determining an unfreeze criteria of the AGC.

Figure 6:
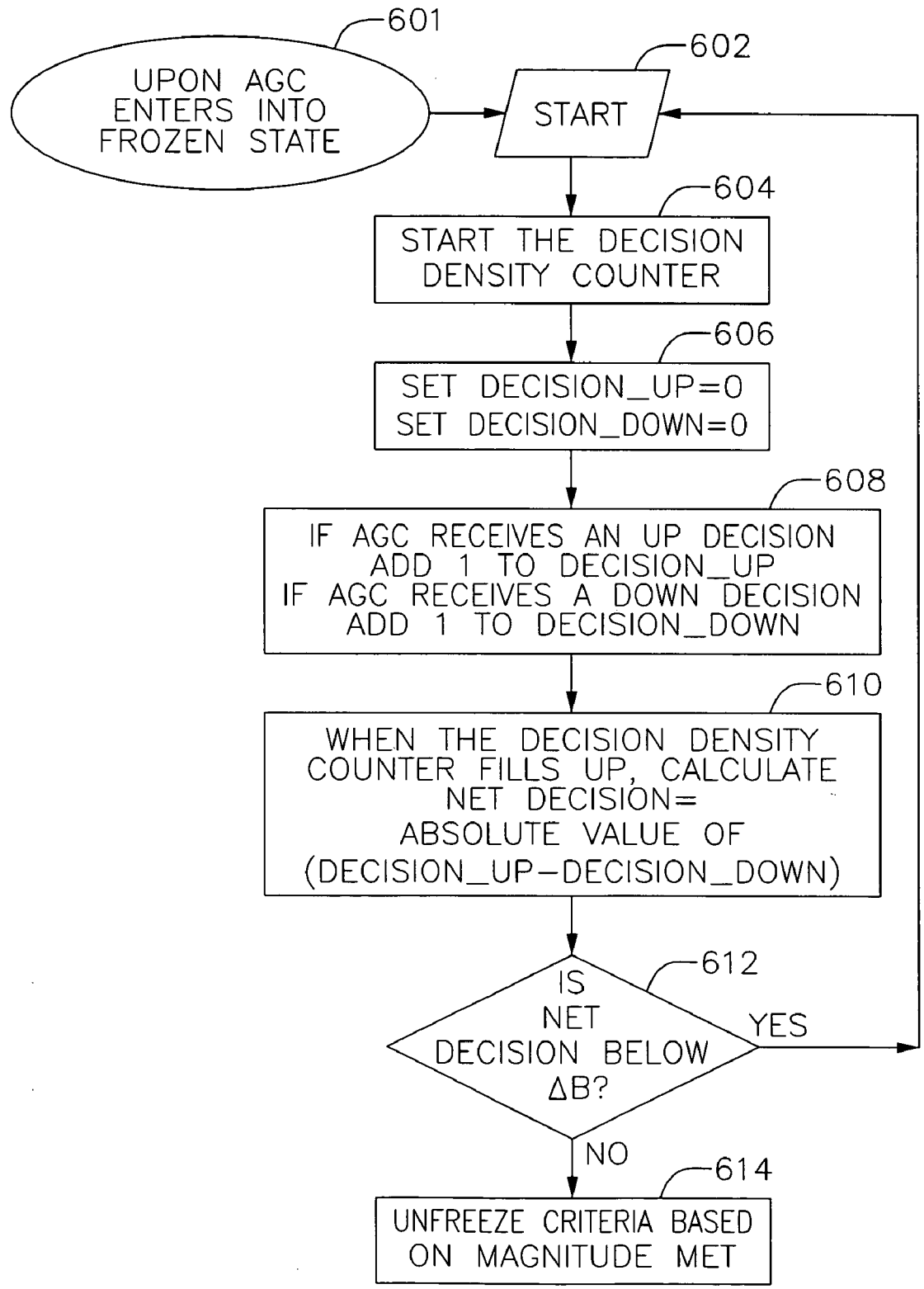
FIG. 6 is an exemplary process flow for determining an unfreeze criteria of an AGC based on the decision density going into AGC, according to one embodiment of the present invention.

FIG. 6 is an exemplary process flow for determining an unfreeze criteria of an AGC based on a decision density, according to one embodiment of the present invention. A decision density counter is utilized to keep track of the decisions at the input of the loop filter within the monitoring window. As illustrated in blocks 601, 602 and 604, upon entering to the FROZEN state, the decision density counter is started. The DECISION_UP counter and the DECISION_DOWN counter are set to zero, in block 606. DECISION_UP corresponds to sum of the decisions to increase the gain of the VGA while, DECISION_DOWN corresponds to sum of the decisions to decrease the gain of the VGA. In other words, when the AGC receives an UP decision from the comparator 205 of FIG. 2, it needs to increase the VGA code, since the VGA output amplitude is smaller than the desired signal level. When the AGC receives a DOWN decision from the comparator 205 of FIG. 2, it needs to decrease the VGA code, since the VGA output amplitude is larger than the desired signal level.

In block 608, if the AGC receives an UP decision, the DECISION_UP counter is incremented by one. Similarly, if the AGC receives a DOWN decision, the DECISION_DOWN counter is incremented by one. As shown in block 608, when the monitoring window is over (i.e., when the decision density counter fills up, a net decision value is calculated as NET DECISION=Absolute Value of (DECISION_UP minus DECISION_DOWN).

In block 612, the NET DECISION is compared to a threshold ΔB. If the NET DECISION value (for a given number of decisions, i.e., the decision monitoring window) falls below ΔB, meaning that VGA output amplitude is approximately equal to the desired signal level, the unfreeze criteria process starts over, in block 602. If the NET DECISION value increases in absolute value and passes above the AB, the unfreeze criteria is met (block 614) and the AGC transitions back to the NORMAL state.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

For example, although in describing the embodiments of the present invention, a digitally controlled VGA and a digital AGC loop are used as examples, a VGA with analog control as well as an analog AGC loop can also be devised which utilize the freezing and unfreezing process of the present invention. In such a case, the analog control signal for VGA is integrated over a predetermined time window to find out the convergence of the VGA loop to the desired signal amplitude for the freezing criteria.

Furthermore, to monitor and/or control an electrical signal, one can utilize, not only amplitude detection, but also power detection, RMS detection, and/or peak detection. Additionally, as mentioned above, the freezing criteria can be repeated more than twice, if needed depending on the application.

What is claimed is:

1. A method for controlling gain of a variable gain amplifier (VGA), the method comprising:
   monitoring a net change in VGA gain, in a normal state;
   transitioning from the normal state to a transition state, if the net change in the VGA gain is less than a first threshold value during a first timing window;
   allowing an automatic gain control (AGC) loop to update the VGA gain, in the transition state;
   monitoring a net change in VGA gain, in the transition state;
   transitioning from the transition state to a frozen state, if the net change in the VGA gain is less than a second threshold value during a second timing window; and
   freezing the VGA gain, when in the frozen state.

2. The method of claim 1, wherein the first threshold value and the second threshold value are the same.

3. The method of claim 1, wherein the first timing window and the second timing window are the same.

4. The method of claim 1, further comprising transitioning from the transition state to the normal state, if the net change in the VGA gain is greater than or equal to the second threshold value during the second timing window.

5. The method of claim 1, further comprising transitioning from the frozen state to the normal state, if the VGA output level deviates from a desired level by more than a predetermined value.

6. The method of claim 1, wherein the VGA gain is obtained by monitoring one or more of the group consisting of amplitude, power, RMS, and peak of the VGA output.

7. The method of claim 5, wherein the predetermined value is a percentage of the desired VGA output level.

8. The method of claim 1, further comprising transitioning from the frozen state to the normal state, if decisions for the VGA gain lean towards one direction with more than a predetermined decision density value.

9. The method of claim 1, further comprising incrementing the first timing window and the second timing window by a signal derived from toggle of the VGA gain control codes.

10. The method of claim 8, further comprising:
   incrementing a first counter by one, if the AGC loop receives an up decision during a decision monitoring window;
   incrementing a second counter by one, if the AGC loop receives a down decision during the decision monitoring window;
   calculating a net decision value as the absolute value of the difference between the first counter and the second counter;
   comparing the calculated net decision value to a decision threshold; and
   transitioning from the frozen state to the normal state, If the absolute value of the net decision value increases above the decision threshold.

11. An automatic gain control (AGC) for controlling gain of a variable gain amplifier (VGA) comprising:
   means for monitoring a net change in VGA gain, in a normal state;
   means for transitioning from the normal state to a transition state, if the net change in the VGA gain is less than a first threshold value during a first timing window;
   means for allowing an automatic gain control (AGC) loop to update the VGA gain, in the transition state;
   means for monitoring a net change in VGA gain, in the transition state;
   means for transitioning from the transition state to a frozen state, if the net change in the VGA gain is less than a second threshold value during a second timing window; and
   means for freezing the VGA gain, when in the frozen state.

12. The AGC of claim 11, further comprising means for transitioning from the transition state to the normal state, if the net change in the VGA gain is not less than the second threshold value during the second timing window.

13. The AGC of claim 11, further comprising means for transitioning from the frozen state to the normal state, if the VGA output level deviates from a desired level by more than a predetermined value.

14. The AGC of claim 13, wherein the VGA gain is obtained by monitoring one or more of the group consisting of amplitude, power, RMS, and peak of the VGA output.

15. The AGC of claim 11, further comprising means for transitioning from the frozen state to the normal state, if decisions for the VGA gain lean towards one direction with more than a predetermined decision density value.

16. The AGC of claim 11, further comprising means for incrementing the first timing window and the second timing window by a signal derived from toggle of the VGA gain control codes.

17. The AGC of claim 15, further comprising:
   means for incrementing a first counter by one, if the AGC loop receives an up decision during a decision monitoring window;
   means for incrementing a second counter by one, if the AGC loop receives a down decision during the decision monitoring window;
   means for calculating a net decision value as the absolute value of the difference between the first counter and the second counter;
   means for comparing the calculated net decision value to a decision threshold; and
   means for transitioning from the frozen state to the normal state, If the absolute value of the net decision value increases above the decision threshold.

18. A method for controlling gain of a variable gain amplifier (VGA), the method comprising:
   updating VGA gain control codes, in a normal state;
   monitoring a net change in VGA gain control codes, in the normal state;
   starting a timing window;
   changing from the normal state to a transition state, when the net change in the VGA gain control codes is less than a predetermined value at the end of the timing window;
   allowing an AGC loop to update VGA gain control codes, in the transition state;
   monitoring a second net change in VGA gain control codes, in the transition state;
   starting the timing window;
   changing from the transition state to a frozen state, if the net change in the VGA gain control codes is less than the predetermined value at the end of the timing window; and
   freezing the VGA gain control codes, when in the frozen state.

19. The method of claim 18, further comprising transitioning from the transition state to the normal state, if the net change in the VGA gain control codes are greater than or equal to a second threshold value during a second timing window.

20. The method of claim 18, further comprising transitioning from the frozen state to the normal state, if the VGA output level deviate from a desired level by more than a predetermined value.

* * * * *